(12) United States Patent
Ahn et al.

(10) Patent No.: US 8,638,543 B2
(45) Date of Patent: Jan. 28, 2014

(54) LAMINATED CHIP ELECTRONIC COMPONENT, BOARD FOR MOUNTING THE SAME, AND PACKING UNIT THEREOF

(75) Inventors: Young Ghyu Ahn, Gyunggi-do (KR); Min Cheol Park, Gyunggi-do (KR); Doo Young Kim, Gyunggi-do (KR); Sang Soo Park, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 13/588,876

(22) Filed: Aug. 17, 2012

(65) Prior Publication Data

US 2013/0321981 A1 Dec. 5, 2013

(30) Foreign Application Priority Data

May 30, 2012 (KR) .................. 10-2012-0057724
Aug. 16, 2012 (KR) .................. 10-2012-0089521

(51) Int. Cl.
*H01G 4/06* (2006.01)
*H01G 4/005* (2006.01)

(52) U.S. Cl.
USPC .......................................... 361/311; 361/303

(58) Field of Classification Search
USPC ............................................. 361/303, 311
See application file for complete search history.

(56) References Cited

U.S. PATENT DOCUMENTS

| 7,092,236 B2 | 8/2006 | Lee et al. |
| 7,252,189 B2 | 8/2007 | Yagi |
| 2003/0183553 A1* | 10/2003 | Fujimura et al. .............. 206/725 |
| 2009/0002918 A1 | 1/2009 | Kawasaki et al. |
| 2009/0067117 A1 | 3/2009 | Kasuya et al. |
| 2011/0114378 A1 | 5/2011 | Yoshii et al. |
| 2011/0290542 A1 | 12/2011 | Nishisaka et al. |
| 2012/0300361 A1 | 11/2012 | Togashi |
| 2013/0038979 A1 | 2/2013 | Togashi |

FOREIGN PATENT DOCUMENTS

| EP | 0866478 A2 | 9/1998 |
| EP | 1538639 A2 | 6/2005 |
| EP | 1715494 A1 | 10/2006 |
| JP | 01281717 A * | 11/1989 |
| JP | 6-215978 A | 8/1994 |

(Continued)

OTHER PUBLICATIONS

Office Action issued in Korean Application No. 10-2012-0089521 dated Mar. 5, 2013.

(Continued)

*Primary Examiner* — Eric Thomas
(74) *Attorney, Agent, or Firm* — McDermott Will & Emery LLP

(57) ABSTRACT

A laminated chip electronic component includes: a ceramic body including internal electrodes and dielectric layers; first and second external electrodes formed to cover both end portions of the ceramic body in a length direction; an active layer in which the internal electrodes are disposed in an opposing manner, while having the dielectric layers interposed therebetween, to form capacitance; upper and lower cover layers formed on upper and lower portions of the active layer in a thickness direction, the lower cover layer having a thickness greater than that of the upper cover layer; and additional electrode layers disposed irrespective of a formation of capacitance within the lower cover layer.

22 Claims, 12 Drawing Sheets

(56) References Cited

FOREIGN PATENT DOCUMENTS

| | | |
|---|---|---|
| JP | 6-268464 A | 9/1994 |
| JP | 07-045469 A | 2/1995 |
| JP | 7-183163 | 7/1995 |
| JP | 8-130160 A | 5/1996 |
| JP | 2001-185446 A | 7/2001 |
| JP | 2007-142342 A | 6/2007 |
| JP | 2011-108827 A | 6/2011 |
| TW | 201003695 A | 1/2010 |
| TW | 201205614 A | 2/2012 |

OTHER PUBLICATIONS

Extended European Search Report issued in European Patent Application No. 12275123.3 dated Mar. 4, 2013.
Japanese Office Action issued in Japanese Patent Application No. JP 2012-227741 dated Sep. 3, 2013.
United States Office Action issued in U.S. Appl. No. 13/749,490 dated Nov. 12, 2013.
Taiwanese Office Action, w/ English translation thereof, issued in Taiwanese Patent Application No. TW 101132127 dated Dec. 6, 2013.

* cited by examiner

LAMINATED CHIP ELECTRONIC COMPONENT, BOARD FOR MOUNTING THE SAME, AND PACKING UNIT THEREOF

CROSS-REFERENCE TO RELATED APPLICATIONS

This application claims the priority of Korean Patent Application Nos. 10-2012-0057724 filed on May 30, 2012, and 10-2012-0089521 filed on Aug. 16, 2012 in the Korean Intellectual Property Office, the disclosure of which is incorporated herein by reference.

BACKGROUND OF THE INVENTION

1. Field of the Invention

The present invention relates to a laminated chip electronic component for reducing acoustic noise generated by the laminated chip electronic component, a board for mounting the same, and a packing unit thereof.

2. Description of the Related Art

A multilayer capacitor, a laminated chip electronic component, includes internal electrodes formed between a plurality of dielectric layers.

When DC or AC voltages are applied to the multilayer capacitor having internal electrodes overlapping with dielectric layers interposed therebetween, a piezoelectric effect takes place between the internal electrodes, generating vibrations.

As permittivity of a dielectric layer becomes higher and the size of a chip is larger based on the same capacitance, generated vibrations become more intense. The generated vibrations are transferred from external electrodes of the multilayer capacitor to a printed circuit board (PCB) on which the multilayer capacitor is mounted. Here, the PCB vibrates to produce a noise.

When the noise produced due to the vibrations of the PCB is included in an audio frequency, a corresponding vibrating sound may make users uncomfortable, and such a sound is known as acoustic noise.

In order to reduce acoustic noise, the inventors of the present invention have conducted research into a mounting direction of internal electrodes within a multilayer capacitor, in relation to a PCB. As a result of the research, it has been recognized that mounting a multilayer capacitor on a PCB to have directionality such that internal electrodes of the multilayer capacitor are horizontal with the PCB may reduce acoustic noise in comparison to a case in which a multilayer capacitor is mounted on the PCB such that internal electrodes thereof are perpendicular to the PCB.

However, even in the case that the multilayer capacitor is mounted on the PCB such that internal electrodes thereof are horizontal with the PCB, acoustic noise may be measured and determined to still be at a certain level or higher, so a further reduction in acoustic noise remains an issue to be studied.

[Prior Art Documents]
(Patent document 1) Japanese Patent Laid Open Publication No. 1994-268464
(Patent document 2) Japanese Patent Laid Open Publication No. 1994-215978
(Patent document 3) Japanese Patent Laid Open Publication No. 1996-130160

Patent document 1 discloses internal electrodes mounted to have horizontal directionality in relation to a PCB, but it has technical characteristics in which a pitch between signal lines is narrowed to reduce high frequency noise. Meanwhile, Patent document 2 and Patent document 3 disclose different thickness of an upper cover layer and a lower cover layer in a multilayer capacitor. However, the documents do not suggest any motive or solution for reducing the acoustic noise. Moreover, the documents absolutely do not disclose or anticipate an extent of how much the central portion of the active layer is deviated from the central portion of the laminated chip capacitor, a ratio of the upper cover layer to the lower cover layer, a ratio of the lower cover layer to the thickness of the ceramic body, and a ratio of the lower cover layer to the thickness of the active layer, etc.

SUMMARY OF THE INVENTION

An aspect of the present invention provides a multilayer capacitor as a laminated chip capacitor in which a lower cover layer is thicker than an upper cover layer, a central portion of an active layer is set to be within a range of deviation from a central portion of a ceramic body, and the lower cover layer includes an additional electrode layer.

Another aspect of the present invention provides a board for mounting a laminated chip electronic component, on which a laminated chip electronic component is mounted such that internal electrodes thereof are horizontal in relation to a printed circuit board (PCB) and a lower cover layer is adjacent to the PCB, thus reducing acoustic noise.

Another aspect of the present invention provides a packing unit of a laminated chip electronic component, in which internal electrodes of a laminated chip electronic component are horizontally disposed and aligned based on a lower surface of a receiving portion of a packing sheet.

According to an aspect of the present invention, there is provided a laminated chip electronic component including: a ceramic body including internal electrodes and dielectric layers; first and second external electrodes formed to cover both end portions of the ceramic body in a length direction; an active layer in which the internal electrodes are disposed in an opposing manner, while having the dielectric layers interposed therebetween, to form capacitance; upper and lower cover layers formed on upper and lower portions of the active layer in a thickness direction, the lower cover layer having a thickness greater than that of the upper cover layer; and additional electrode layers disposed irrespective of a formation of capacitance within the lower cover layer, wherein when half of a thickness of the ceramic body is defined as A, a thickness of the lower cover layer is defined as B, half of a thickness of the active layer is defined as C, and a thickness of the upper cover layer is defined as D, the thickness (D) of the upper cover layer satisfies a range of D≥4 μm and a ratio (B+C)/A by which a central portion of the active layer deviates from a central portion of the ceramic body satisfies a range of $1.069 \leq (B+C)/A \leq 1.763$.

A ratio (D/B) of the thickness (D) of the upper cover layer to the thickness (B) of the lower cover layer may satisfy $0.018 \leq D/B \leq 0.372$.

A ratio (B/A) of the thickness (B) of the lover cover layer to the half (A) of the thickness of the ceramic body may satisfy $0.215 \leq B/A \leq 1.553$.

A ratio (C/B) of the half (C) of the thickness of the active layer to the thickness (B) of the lower cover layer may satisfy $0.135 \leq C/B \leq 3.987$.

A mark for differentiating upper and lower portions may be formed on at least one of upper and lower surfaces of the ceramic body.

The additional electrode layers may include: a first array electrode layer formed by laminating first electrode patterns extending inwardly from the first external electrode in a length direction, while having dielectric layers interposed therebetween, in a thickness direction; and a second array electrode layer formed by laminating second electrode patterns extending inwardly from the second external electrode in the length direction to face the first electrode patterns, while having dielectric layers interposed therebetween, in the thickness direction.

The additional electrode layers may include floating electrode layers facing the first external electrode and second external electrode and laminated in the thickness direction.

The additional electrode layers may extend inwardly from the first external electrode or the second external electrode in the length direction to face the second external electrode or the first external electrode having a different polarity, and may be laminated in the thickness direction.

The additional electrode layers may be a plurality of floating electrode layers facing the first external electrode and the second external electrode and laminated in the thickness direction, and the plurality of floating electrode layers may face inwardly in the length direction.

The additional electrode layers may include: a first array electrode layer formed by laminating first electrode patterns extending inwardly from the first external electrode in the length direction, while having dielectric layers interposed therebetween, in the thickness direction; a second array electrode layer formed by laminating second electrode patterns extending inwardly from the second external electrode in the length direction to face the first electrode patterns, while having dielectric layers interposed therebetween, in the thickness direction; and a floating electrode layer formed between the first array electrode layer and the second array electrode layer and facing the first array electrode layer and the second array electrode layer.

The additional electrode layers may include: a first electrode pattern and a second electrode pattern extending inwardly from the first external electrode and the second external electrode in the length direction, respectively, and opposed to each other; and a floating electrode pattern disposed between the first electrode pattern and the second electrode pattern, while having a dielectric layer interposed therebetween.

A gap formed between the first electrode pattern and the second electrode pattern in the length direction may have directionality such that the gap is reduced or increased in a lamination direction.

The additional electrode layers may include: a first electrode pattern and a second electrode pattern extending inwardly from the first external electrode and the second external electrode in the length direction, respectively, and opposed to each other; and a third electrode pattern and a fourth electrode pattern disposed to face the first electrode pattern and the second electrode pattern, while having a dielectric layer interposed therebetween, and extending inwardly from the first external electrode and the second external electrode in the length direction, respectively, to face each other, wherein a gap between the first electrode pattern and the second electrode pattern in the length direction and a gap between the third electrode pattern and the fourth electrode pattern in the length direction may be offset in the lamination direction.

According to another aspect of the present invention, there is provided a laminated chip electronic component including: external electrodes formed on both end portions of a ceramic body having a hexahedral shape in a length direction; an active layer formed within the ceramic body and including a plurality of internal electrodes disposed to face each other, while having dielectric layers interposed therebetween to form capacitance; an upper cover layer formed on an upper portion of the uppermost internal electrode of the active layer; a lower cover layer formed on a lower portion of the lowermost internal electrode of the active layer and having a thickness greater than that of the upper cover layer; and additional electrode layers disposed irrespective of a formation of capacitance within the lower cover layer.

Due to a difference between strain generated in a central portion of the active layer and that generated in the lower cover layer as a voltage is applied, a point of inflection (PI) may be formed at both end portions of the ceramic body in the length direction, which are lower than the central portion of the ceramic body in the thickness direction.

When half of the overall thickness of the ceramic body is defined as A, a thickness of the lower cover layer is defined as B, and half of the overall thickness of the active layer is defined as C, a ratio (B+C)/A by which a central portion of the active layer deviates from a central portion of the ceramic body may satisfy a range of $1.069 \leq (B+C)/A \leq 1.763$.

According to another aspect of the present invention, there is provided a board for mounting a laminated chip electronic component, including: a laminated chip electronic component according to an embodiment of the present invention; electrode pads electrically connected to the external electrodes through soldering; and a printed circuit board (PCB) on which the electrode pads are formed and the laminated chip electronic component is mounted on the electrode pads such that the internal electrodes are horizontal and the lower cover layer is disposed in a lower position than the upper cover layer in a thickness direction.

Due to a difference between strain generated in a central portion of the active layer and that generated in the lower cover layer as a voltage is applied, a point of inflection (PI) formed at both end portions of the ceramic body in a length direction may be formed to be lower than the height of the soldering.

According to another aspect of the present invention, there is provided a packing unit including: a laminated chip electronic component according to an embodiment of the present invention; and a packing sheet including a receiving portion for receiving the laminated chip electronic component, wherein the internal electrodes are disposed to be aligned horizontally, based on a lower surface of the receiving portion.

The packing unit may further include: a packing film coupled to the packing sheet and covering the laminated chip electronic component.

The packing sheet in which the laminated chip electronic component is received may be wound as a reel type.

Each of the laminated chip electronic components received in the receiving portion may be disposed such that the lower cover layer thereof faces the lower surface of the receiving portion.

A mark for differentiating upper and lower portions may be formed on an upper surface of the ceramic body.

Each of the laminated chip electronic components received in the receiving portion may have directionality such that any one of the upper cover layer and the lower cover layer faces the lower surface of the receiving portion, and a mark may be formed on the ceramic body in order to allow the directionality in which any one of the upper cover layer and the lower cover layer faces the lower surface of the receiving portion, to be recognized from the outside.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
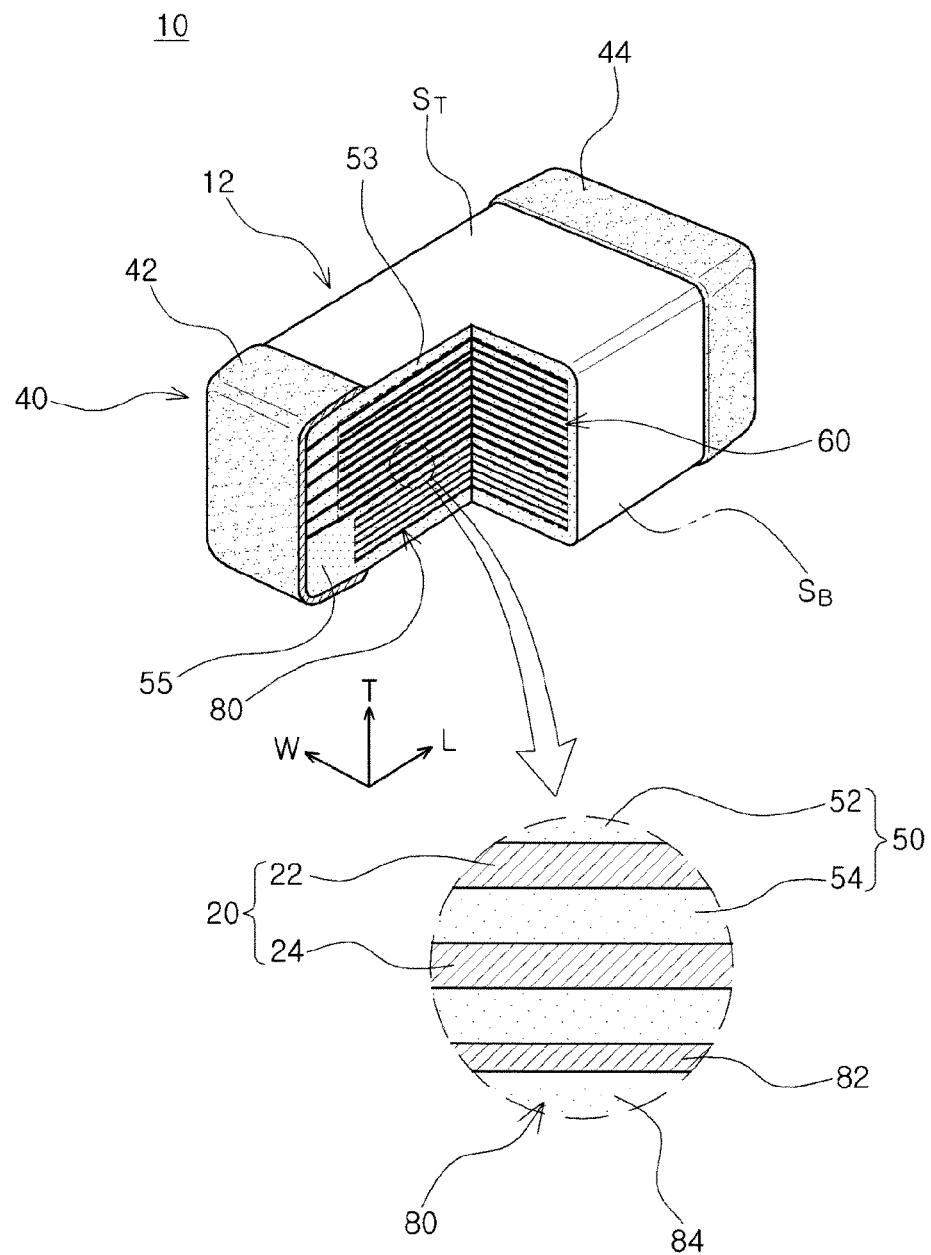
FIG. 1 is a schematic cutaway perspective view of a laminated chip capacitor according to an embodiment of the present invention.

Embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like components.

A laminated chip electronic component according to an embodiment of the present invention may be able to be used in a multilayer ceramic capacitor, a laminated varistor, a thermistor, a piezoelectric element, a multilayer substrate, and the like, which uses dielectric layers and has a structure in which internal electrodes face with the dielectric layer interposed therebetween.

Also, elements having the same function within a scope of the same concept illustrated in drawings of respective embodiments will be described by using the same reference numerals.

Laminated Chip Capacitor

Figure 2:
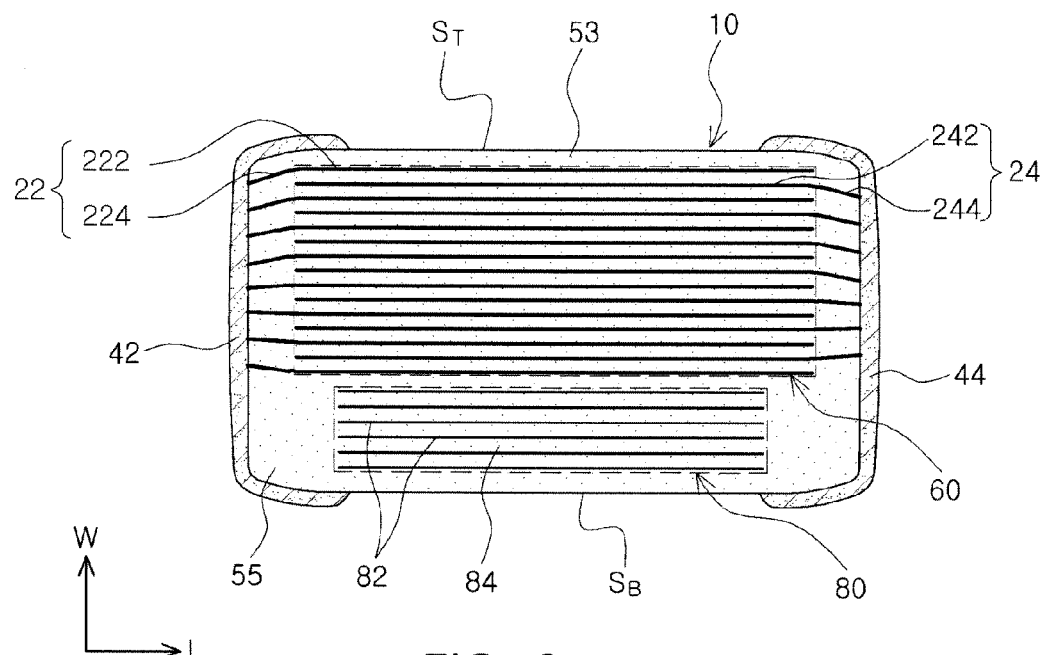
FIG. 2 is a cross-sectional view of the laminated chip capacitor of FIG. 1 taken in length and thickness directions.
Figure 3:
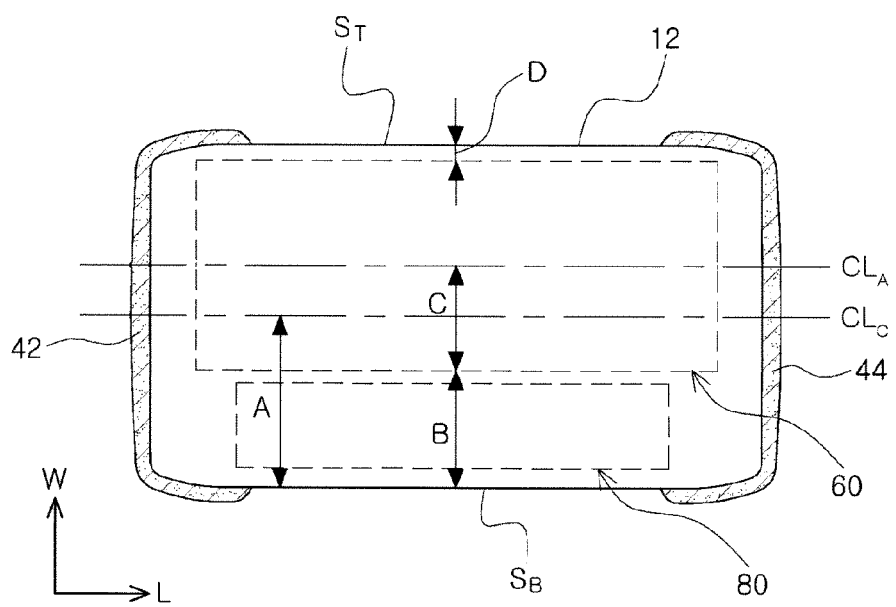
FIG. 3 is a schematic cross-sectional view of the laminated chip capacitor of FIG. 1 taken in the length and thickness directions showing dimensions.

FIG. 1 is a schematic cutaway perspective view of a laminated chip capacitor according to an embodiment of the present invention. FIG. 2 is a cross-sectional view of the laminated chip capacitor of FIG. 1 taken in length and thickness directions. FIG. 3 is a schematic cross-sectional view of the laminated chip capacitor of FIG. 1 taken in the length and thickness directions showing dimensions.

With reference to FIGS. 1 through 3, a laminated chip capacitor 10 may include a ceramic body 12, an external electrode 40, an active layer 60, upper and lower cover layers 53 and 55, and additional electrode layers 80.

The ceramic body 12 may be fabricated by applying a conductive paste to a ceramic green sheet to form an internal electrode 20, laminating the ceramic green sheets each having the internal electrode 20 formed thereon, and firing the same. The ceramic body 12 may be formed by repeatedly laminating a plurality of dielectric layers 52 and 54 and internal electrodes 22 and 24.

The ceramic body 12 may have a hexahedral shape. When the chip is fired, ceramic powder is shrunken, so the ceramic body 12 may not have a hexahedral shape with entirely straight lines, yet it may have substantially hexahedral shape.

In order to clarify embodiments of the present invention, directions of the hexahedron may be defined as follows: L, W, and T indicated in FIG. 1 denote a length direction, a width direction, and a thickness direction, respectively. Here, the thickness direction may be used to have the same concept as that of a lamination direction in which the dielectric layers are laminated.

The embodiment of FIG. 1 is a laminated chip capacitor 10 having a rectangular parallelepiped shape in which a length thereof is greater than width and thickness thereof.

Ceramic powder having high K-dielectrics (or high dielectric constant) may be used as a material of the dielectric layer 50 in order to obtain high capacitance. As the ceramic powder, for example, barium titanate ($BaTiO_3$)-based powder, strontium titanate ($SrTiO_3$)-based powder, or the like, may be used but the present invention is not limited thereto.

The first and second external electrodes 42 and 44 may be formed with a conductive paste including metal powder. As metal used for a metal powder included in the conductive paste, copper (Cu), nickel (Ni), or an alloy thereof may be used, but the present invention is not particularly limited thereto.

The internal electrodes 20 may include a first internal electrode 22 and a second internal electrode 24, and the first and second internal electrodes 22 and 24 may be electrically connected to the first and second external electrodes 42 and 44, respectively.

Here, the first internal electrode 22 and the second internal electrode 24 may include first and second electrode pattern portions 222 and 242 which overlap in an opposing manner with the dielectric layer 54 (Please See FIG. 1) interposed therebetween and first and second lead portions 224 and 244 led out to the first and second external electrodes 42 and 44, respectively.

The first and second electrode pattern portions 222 and 242 may be successively laminated in the thickness direction to constitute the active layer 60 forming capacitance within the ceramic body 12.

In view of the section of the laminated chip capacitor in the length direction and thickness direction, portions other than the active layer 60 may be defined as margin portions. Among the margin portions, upper and lower margin portions of the active layer 60 in the thickness direction may particularly be defined as the upper cover layer 53 and the lower cover layer 55.

Like the dielectric layers 52 and 54 formed between the first internal electrode 22 and the second internal electrode 24, the upper cover layer 53 and the lower cover layer 55 may be formed as ceramic green sheets are sintered.

The plurality of dielectric layers 50 including the upper cover layer 53 and the lower cover layer 55 are in a sintered state and adjacent dielectric layers 50 may be integrated such that boundaries therebetween may not be readily apparent without the use of a scanning electron microscope (SEM).

In the present embodiment, the lower cover layer 55 may have a thickness greater than that of the upper cover layer 53. Namely, by increasing the lamination number of ceramic green sheets in comparison to the upper cover layer 53, the lower cover layer 55 may have a thickness greater than that of upper cover layer 53.

Thus, with the structure in which the upper cover layer 53 and the lower cover layer 55 are formed to be asymmetrical, if an electrode is not formed in the lower cover layer 55, a delamination or crack defects may increase due to a difference in shrinkage rates between the active layer 60 and the lower cover layer 55 when they are sintered to be shrunken.

Thus, an internal electrode layer may be added to the lower cover layer 55 to reduce the difference in shrinkage rates between the active layer 60 and the lower cover layer 55 to obtain the effect of reducing acoustic noise as well as reducing delamination or crack generation.

The additional electrode layers 80 are internal electrodes 82 disposed within the lower cover layer 55, not having such a structure that the internal electrodes having different polarities overlap with the dielectric layers 84 interposed therebetween. Thus, the additional electrode layers 80 do not contribute to a formation of capacitance except for parasitic capacitance generated due to an influence of the external electrodes 42 and 44 on both end portions of the ceramic body 12 in the length direction or the active layer 60 forming capacitance.

In the present embodiment, the additional electrode layer 80 may be floating electrode layers which are laminated in the thickness direction and face the first external electrode 42 and the second external electrode 44 without being in electrically contact therewith in the lower cover layer 55.

With reference to FIG. 3, the laminated chip capacitor according the present embodiment may be more clearly defined.

First, it may be defined such that half of the overall thickness of the ceramic body 12 is A, a thickness of the lower cover layer 55 is B, half of the overall thickness of the active layer 60 is C, and a thickness of the upper cover layer 53 is D.

The overall thickness of the ceramic body 12 does not include a thickness of the external electrodes 40 coated on an upper surface $S_T$ and a lower surface $S_B$ of the ceramic body 12. In the present embodiment, half of a distance (thickness) from the upper surface $S_T$ to the lower surface $S_B$ of the ceramic body 12 is defined as A.

The thickness B of the lower cover layer 55 is defined as a distance from a lower surface of the lowermost internal electrode of the active layer 60 in the thickness direction to the lower surface $S_B$ of the ceramic body 12. The thickness D of the upper cover layer 53 is defined as a distance from an upper surface of the uppermost internal electrode of the active layer 60 in the thickness direction to the upper surface $S_T$ of the ceramic body 12.

Here, the overall thickness of the active layer 60 refers to a distance from an upper surface of the uppermost internal electrode of the active layer 60 to a lower surface of the lowermost internal electrode of the active layer 60. C is defined as half of the active layer 60.

In the present embodiment, the thickness of the upper cover layer 53 may satisfy a range of $D \geq 4$ μm. When D is smaller than 4 μm, the internal electrode may be exposed from the upper surface $S_T$ of the ceramic body 12, resulting in a defective product.

Also, in the present embodiment, a ratio (B+C)/A in which the central portion of the active layer 60 deviates from a central portion of the ceramic body 12 may satisfy $1.069 \leq (B+C)/A \leq 1.763$.

Here, the central portion of the active layer may be defined as within 1 μm up and down from a center line $CL_A$, a central point between the upper surface of the uppermost internal electrode of the active layer 60 and the lower surface of the lowermost internal electrode of the active layer 60.

Also, the central portion of the ceramic body 12 may be defined as within 1 μm up and down from a center line $CL_C$ of the ceramic body as a central point between the upper surface $S_T$ and the lower surface $S_B$ of the ceramic body 12.

When voltages having different polarities are applied to the first and second external electrodes 42 and formed on both end portions of the laminated chip capacitor 10, the ceramic body 12 expands and contracts in the thickness direction due to an inverse piezoelectric effect of the dielectric layers 50, while the both end portions of the first and second external electrodes 42 and 44 in the thickness direction contract and expand due to a Poisson effect, contrary to the expansion and contraction of the ceramic body 12 in the thickness direction.

Here, the central portion of the active layer 60 is a portion maximally expanded and contracted in both end portions of the first and second external electrodes 42 and 44 in the length direction, causing acoustic noise.

In the present embodiment, in order to reduce acoustic noise, the central portion of the active layer 60 is defined as being outside of the central portion of the ceramic body 12.

Meanwhile, in the present embodiment, due to a difference between strain generated in the central portion of the active layer 60 and that generated in the lower cover layer 55 as a voltage is applied, a point of inflection may be formed at both end portions of the ceramic body 12 in the length direction, which are lower than the central portion of the ceramic body 12 in the thickness direction.

In order to reduce acoustic noise, in the present embodiment, the ratio (D/B) of the thickness (D) of the upper cover layer to the thickness (B) of the lower cover layer may satisfy $0.018 \leq D/B \leq 0.372$.

Also, the ratio (B/A) of the thickness (B) of the lover cover layer to the half (A) of the thickness of the ceramic body may satisfy 0.215≤B/A≤1.553.

The ratio (C/B) of the half (C) of the thickness of the active layer to the thickness (B) of the lower cover layer may satisfy 0.135≤C/B≤3.987.

Meanwhile, in order to mount the lower cover layer 55 having a thickness greater than that of the upper cover layer 53 such that it is adjacent to an upper surface of a printed circuit board (PCB), a mark for differentiating upper and lower portions may be formed on at least one of the upper and lower surfaces of the ceramic body 12.

Board for Mounting Laminated Chip Capacitor

Figure 4:
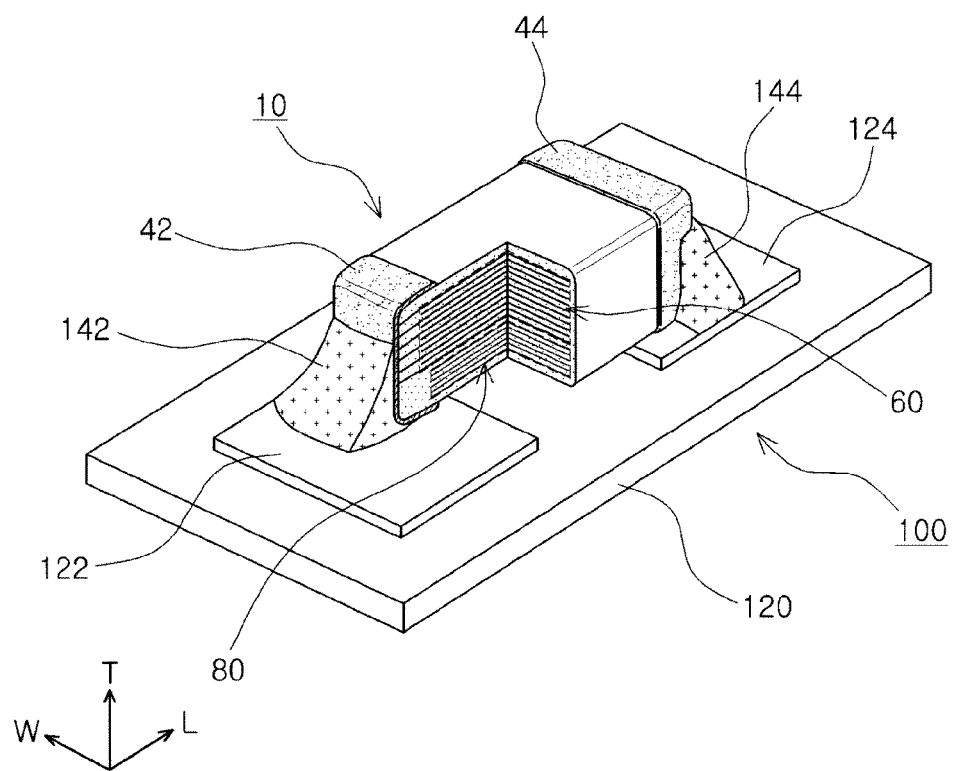
FIG. 4 is a schematic perspective view of the laminated chip capacitor of FIG. 1 mounted on a printed circuit board (PCB)
Figure 5:
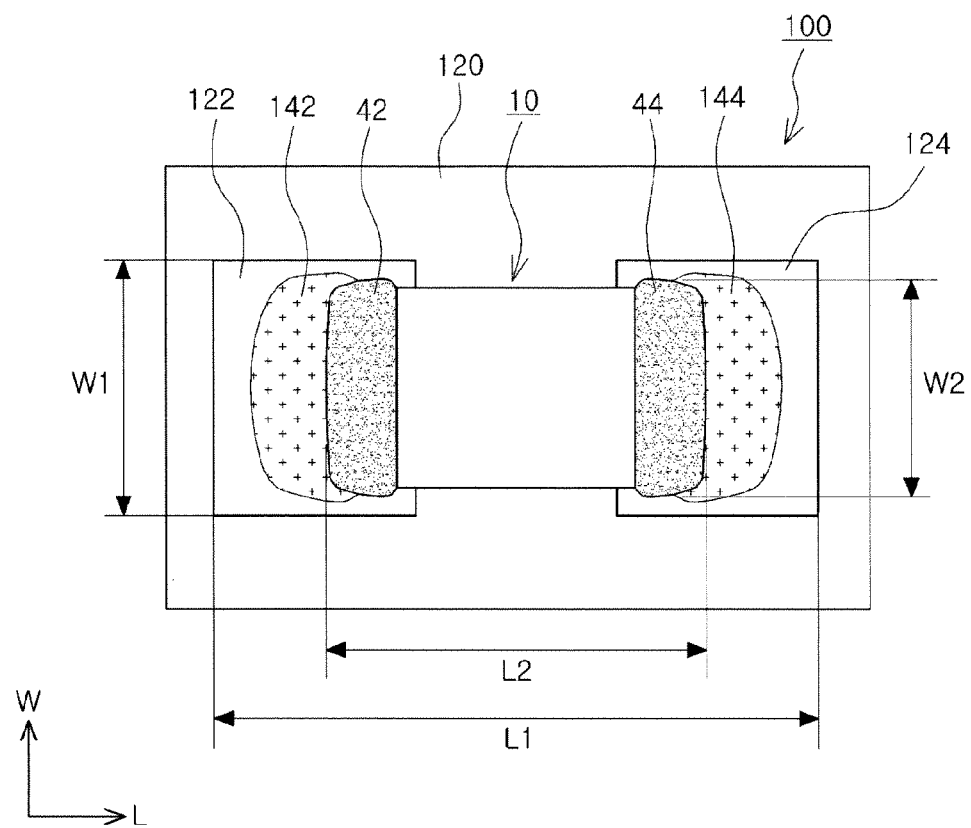
FIG. 5 is a schematic plan view of the laminated chip capacitor of FIG. 4 mounted on the PCB.
Figure 6:
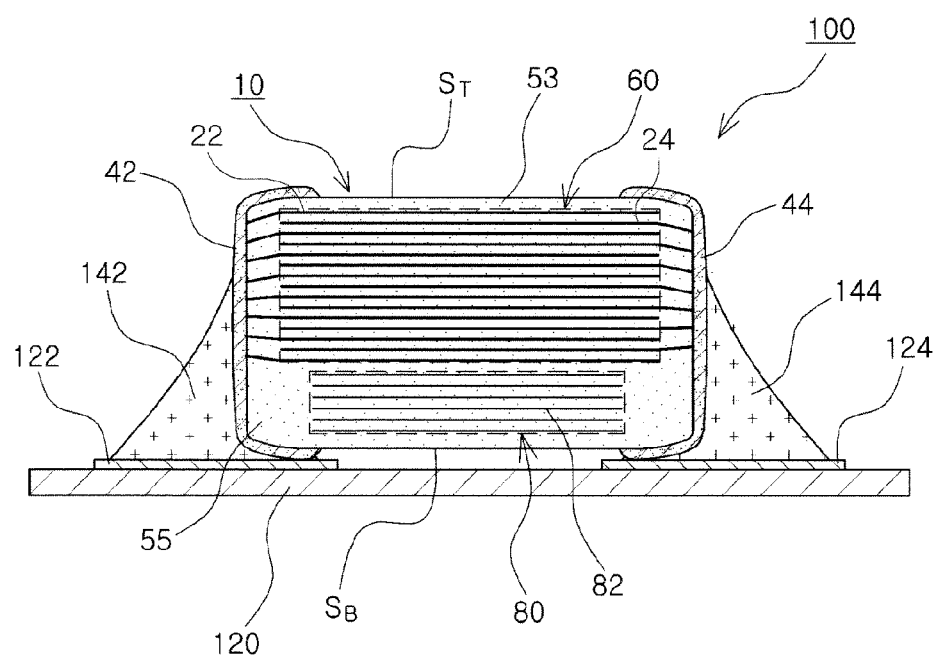
FIG. 6 is a cross-sectional view of the laminated chip capacitor of FIG. 4 mounted on the PCB taken in the length and thickness directions.

FIG. 4 is a schematic perspective view of the laminated chip capacitor of FIG. 1 mounted on a printed circuit board (PCB). FIG. 5 is a schematic plan view of the laminated chip capacitor of FIG. 4 mounted on the PCB. FIG. 6 is a cross-sectional view of the laminated chip capacitor of FIG. 4 mounted on the PCB taken in the length and thickness directions.

A board 100 for mounting a laminated chip capacitor thereon according to an embodiment of the present invention may include the laminated chip electronic component 10, electrode pads 122 and 124, and a printed circuit board 120.

The laminated chip electronic component 10 may be the laminated chip capacitor as described above, and the laminated chip capacitor 10 may be mounted on the PCB such that the internal electrodes 22 and 24 are horizontal to the PCB 120.

Also, the laminated chip capacitor 10 may be mounted on the PCB 120 such that the lower cover layer 55 thicker than the upper cover layer 53 within the ceramic body 12 of the laminated chip capacitor 10 is disposed in a lower side than the upper cover layer 53 in the thickness direction.

When a voltage is applied to the laminated chip capacitor 10 mounted on the PCB 120, acoustic noise is generated. Here, a size of the electrode pads 122 and 124 may determine an amount of solders 142 and 144 connecting the first and second external electrodes 42 and 44 and the electrode pads 122 and 124, respectively, and reduce acoustic noise.

Figure 7:
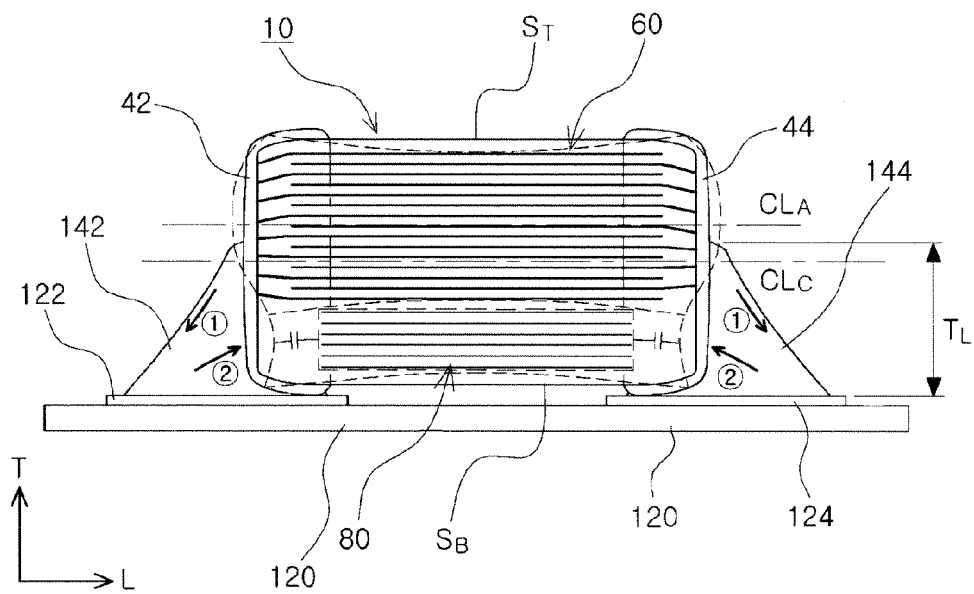
FIG. 7 is a schematic cross-sectional view showing the laminated chip capacitor of FIG. 4 mounted on the PCB which is deformed as a voltage is applied thereto.

FIG. 7 is a schematic cross-sectional view showing the laminated chip capacitor of FIG. 4 mounted on the PCB which is deformed as a voltage is applied thereto.

With reference to FIG. 7, with the laminated chip capacitor 10 mounted on the PCB 120, when voltages having different polarities are applied to the first and second external electrodes 42 and 44 formed on both end portions of the laminated chip capacitor 10, the ceramic body 12 expands and contracts in the thickness direction due to inverse piezoelectric effect of the dielectric layers 50, while the both end portions of the first and second external electrodes 42 and 44 in the length direction contract and expand due to a Poisson effect, contrary to the expansion and contraction of the ceramic body 12 in the thickness direction.

Meanwhile, in the present embodiment, due to a difference between strain generated in the central portion of the active layer 60 and that generated in the lower cover layer 55, a point of inflection (PI) may be formed at both end portions of the ceramic body 12 in the length direction, which are lower than the central portion of the ceramic body 12 in the thickness direction.

The PI is a point at which the phase of an outer surface of the ceramic body 12 is changed. The PI may be formed to be equal to or lower than a height of the solders 142 and 144 formed on the external electrodes 42 and 44 of the laminated chip capacitor 10 on the electrode pads 122 and 124.

Here, the central portion of the active layer 60 is a portion which is maximally expanded and contracted in both end portions of the ceramic body 12 in the length direction according to a voltage application.

Parasitic capacitance of the additional electrode layers 80 generated due to an influence of external electrodes 42 and 44 at both end portions of the ceramic body 12 in the length direction or the active layer 60 forming capacitance may accelerate a formation of the PI at both end portions of the ceramic body 12 in the length direction.

In FIG. 7, it can be seen that both end portions of the laminated chip capacitor 10 in the length direction are maximally expanded, and when both end portions of the laminated chip capacitor 10 in the length direction are maximally expanded, force □ thrusting upper portions of the solders 142 and 144 outwardly due to the expansion is generated, and contracting force □ thrusting the external electrodes is generated at the lower portions of the solders 142 and 144 by the force □ thrust to the outside.

Thus, a PI may be formed in a position lower than the height of the solders.

With reference to FIG. 5, a distance between both end portions of the first electrode pad 122 and the second electrode pad 124 is defined as L1 and a distance between the outer surfaces of the first external electrode 42 and the second external electrode 44 of the laminated chip capacitor 10 is defined as L2. Also, a distance between both end portions of the first electrode pad 122 and the second electrode pad 124 is defined as W1, and a distance between outer surfaces of the first external electrode 42 and the second external electrode 44 is defined as W2.

Figure 8A:
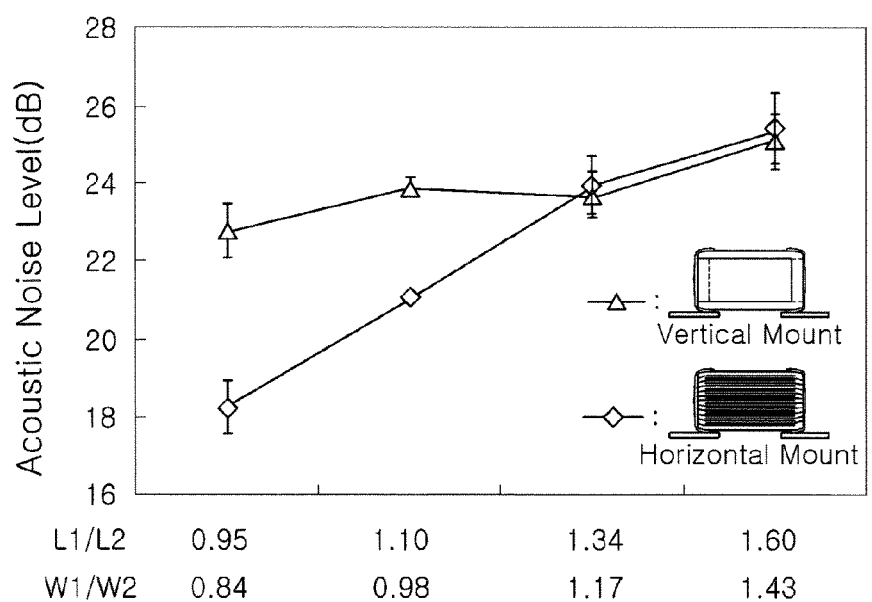
FIG. 8A is a graph showing a change in acoustic noise over electrode pad size when internal electrodes of a related art laminated chip capacitor are mounted to be vertical in relation to a PCB and mounted to be horizontal in relation to the PCB.

FIG. 8A is a graph showing a change in acoustic noise over electrode pad size when internal electrodes of a related art laminated chip capacitor are mounted vertically on a PCB and mounted horizontally on the PCB.

With reference to FIG. 8A, it can be seen that, when the size, i.e., L1/L2, of the electrode pad is reduced to be equal to or smaller than 1.34 and 1.17, in case of the laminated chip capacitor in which internal electrodes are mounted horizontally on the PCB, acoustic noise is reduced.

However, it can be seen that, in the case of the laminated chip capacitor in which internal electrodes are mounted vertically on the PCB, acoustic noise is not greatly reduced.

Namely, the size of the electrode pad has a different tendency in reducing acoustic noise according to whether the internal electrodes of the laminated chip capacitor are horizontally or vertically mounted on the PCB.

Figure 8B:
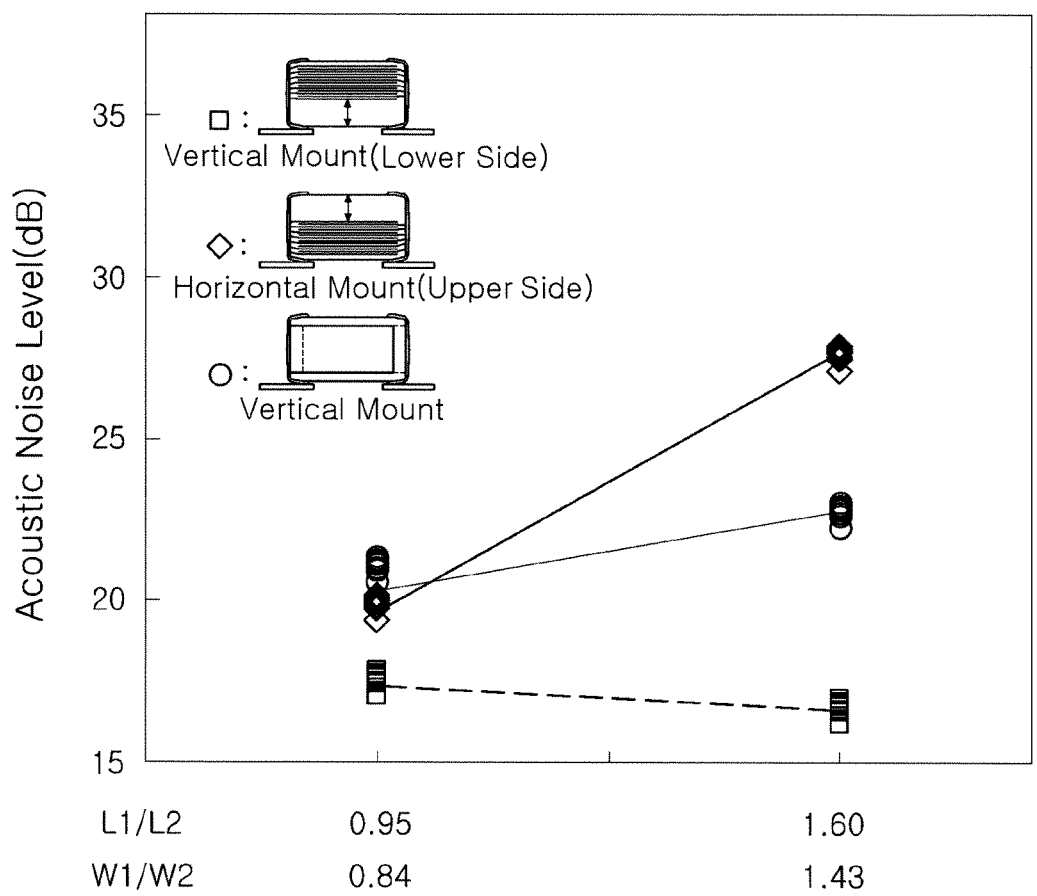
FIG. 8B is a graph showing a change in acoustic noise over electrode pad size when a laminated chip capacitor is mounted on a PCB such that internal electrodes are horizontal in relation to the PCB and a lower cover layer is adjacent to the PCB according to an embodiment of the present invention.

FIG. 8B is a graph showing a change in acoustic noise over electrode pad size when the laminated chip capacitor is mounted on a PCB such that internal electrodes are horizontal to the PCB and the lower cover layer is adjacent to the PCB according to an embodiment of the present invention.

With reference to FIG. 8B, it can be seen that the acoustic noise is different according to whether the thickness of the lower cover layer is thicker than that of the upper cover layer, even when the laminated chip capacitor is mounted on a PCB such that internal electrodes are horizontal to the PCB. Therefore, in order to further reduce the acoustic noise, it can be seen that another parameter is required.

According to example embodiments of the present invention, acoustic noise may be further reduced by controlling an extent of how much the central portion of the active layer is deviated from the central portion of the laminated chip capacitor, a ratio of the upper cover layer to the lower cover layer, a ratio of the lower cover layer to the thickness of the ceramic body, and a ratio of the lower cover layer to the thickness of the active layer, etc.

According to example embodiments of the present invention, it can be seen that the ratio ((B+C)/A) by which the central portion of the active layer 60 deviates from the central portion of the ceramic body 12 satisfies 1.069≤(B+C)/A≤1.763, the acoustic noise may be sufficiently reduced even when the electrode pad is small so the amount of solder is small, and the acoustic noise may be further reduced rather when the electrode pad is large.

That is, when the ratio ((B+C)/A) by which the central portion of the active layer 60 deviates from the central portion of the ceramic body 12 satisfies 1.069≤(B+C)/A≤1.763, acoustic noise can be significantly reduced irrespective of the size of the electrode pad. Herein, A, B and C represents a half of the thickness of the ceramic body, the thickness of the lower cover layer and a half of the thickness of the active layer, respectively.

This is understood to mean that, when the ratio ((B+C)/A) by which the central portion of the active layer 60 deviates from the central portion of the ceramic body 12 satisfies the range 1.069≤(B+C)/A≤1.763, a maximum displacement of the laminated chip capacitor corresponds to an upper portion of the central portion of the ceramic body 12 based on the center of the active layer 60, and thus, displacement transferred to the PCB 120 through the solder is reduced to result in a reduction of the acoustic noise.

Packing Unit of Laminated Chip Capacitor

Figure 9:
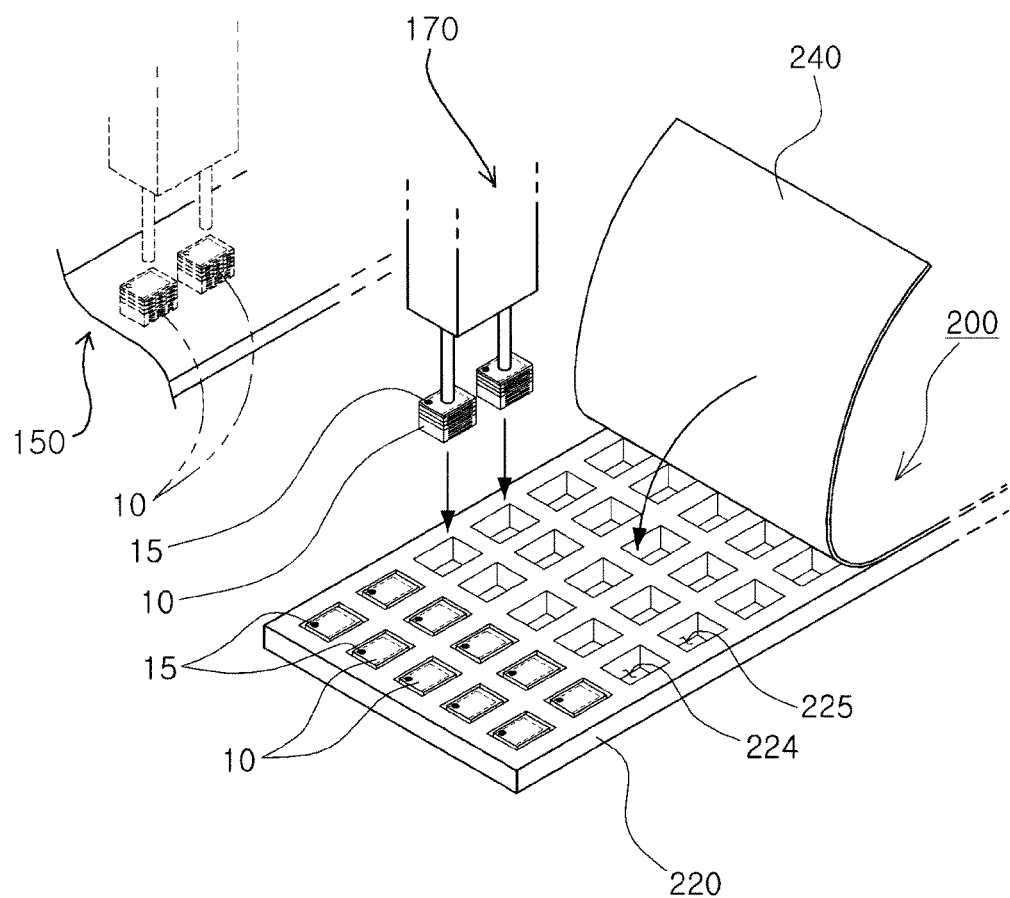
FIG. 9 is a schematic perspective view illustrating mounting of laminated chip capacitors in a packing unit according to an embodiment of the present invention.
Figure 10:
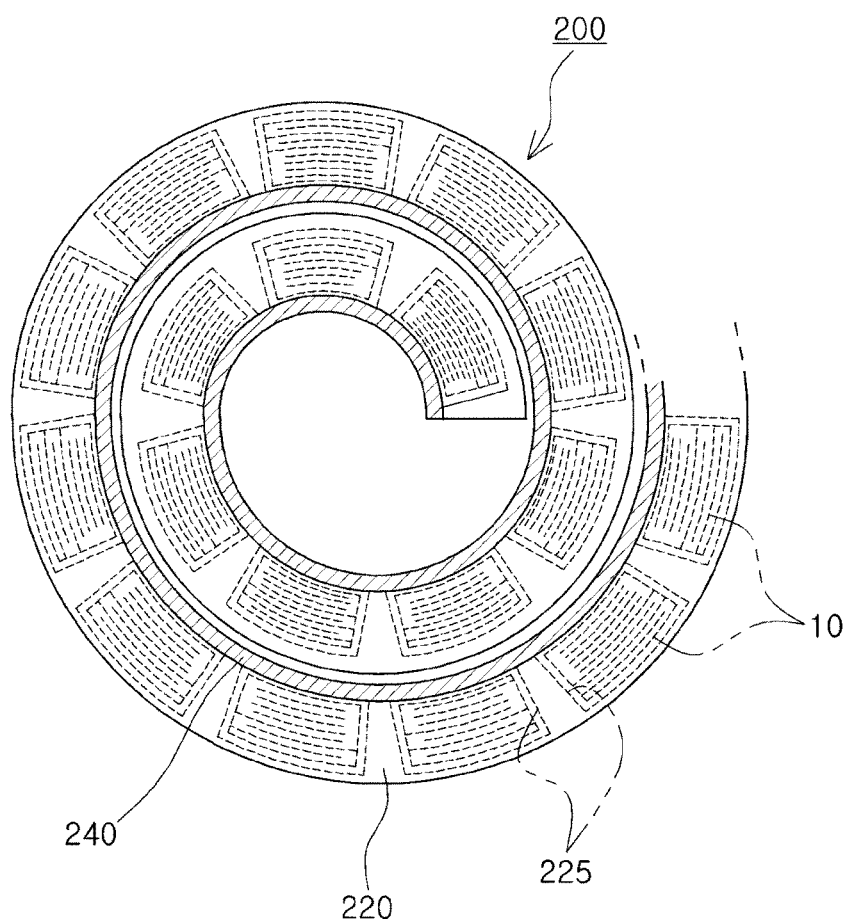
FIG. 10 is a schematic sectional view illustrating the packing unit of FIG. 9 wound in a reel shape.

FIG. 9 is a schematic perspective view illustrating mounting of laminated chip capacitors in a packing unit according to an embodiment of the present invention, and FIG. 10 is a schematic sectional view illustrating the packing unit of FIG. 9 wound in a reel shape.

With reference to FIG. 9, a packing unit 200 for packing a laminated chip capacitor according to the present embodiment may include a packing sheet 220 having a receiving portion 224 in which the laminated chip capacitor 10 is received.

The receiving portion 224 of the packing sheet 220 has a shape corresponding to an electronic component 10, and internal electrodes may be disposed horizontally based on a lower surface 225 of the receiving portion 224.

The laminated chip capacitor 10 is maintained in a state in which the internal electrodes thereof are aligned horizontally through an electronic component alignment device 150 and moved to the packing sheet 220 through a transfer device 170. Thus, the internal electrodes may be disposed to be horizontal based on the lower surface 225 of the receiving portion 224. In this manner, all the laminated chip capacitors 10 in the packing sheet 220 may be disposed to have the same directionality in the packing sheet 220.

Each of the laminated chip capacitors 10 received in the receiving portions 224 may be disposed such that the lower cover layer 55 faces the lower surface of the receiving portion 224. Also, a mark for differentiating upper and lower portions may be formed on an upper surface of the ceramic body 12.

The packing unit 200 for packing the laminated chip capacitor may further include a packing film 240 covering the packing sheet 220 in which the electronic component 10 is received such that the internal electrodes are disposed horizontally based on the lower surface of the receiving portion 225.

FIG. 10 illustrates the packing unit 200 for packing the laminated chip capacitor, which is wound in a reel shape. The packing unit 200 may be continuously wound to be formed.

Experimental Example

Multilayer ceramic capacitors (MLCC) according to embodiments of the present invention and comparative examples were fabricated as follows.

The MLCCs according to the Examples were manufactured through the following steps.

First, slurry including powder such as barium titanate (BaTiO$_3$), or the like, was applied to a carrier film and then dried to prepare a plurality of ceramic green sheets having a thickness of 1.8 μm.

Next, internal electrodes were formed by applying a conductive paste for a nickel internal electrode on the ceramic green sheets by using a screen.

About three hundreds and seventy (370) ceramic green sheets were laminated, and other ceramic green sheets each having an internal electrode pattern which does not contribute to a formation of capacitance were laminated below the ceramic green sheets with the internal electrodes formed thereon in order to form additional electrode layers. Here, ten to thirty additional electrode layers may be formed.

The laminate (or lamination body) was isostatic-pressed under a pressure condition of 1000 kgf/cm$^2$ at 85° C. The pressing-completed ceramic laminate was severed into individual chips, and a debinding process was performed by maintaining the severed chips at 230° C. for 60 hours under an air atmosphere.

Thereafter, the chips were fired at an oxygen partial pressure of $10^{-11}$ atm~$10^{-10}$ atm, lower than a Ni/NiO equilibrium oxygen partial pressure, under a reduced atmosphere such that the internal electrodes were not oxidized. After the firing operation, a chip size (length×width (L×W)) of a laminated chip capacitor was 1.64 mm×0.88 mm (L×W, 1608 size). Here, a fabrication tolerance was determined to be ±0.1 mm in length×width, and acoustic noise of a chip satisfying the fabrication tolerance was measured in the experimentation.

Thereafter, the chip was subjected to processes such as an external electrode formation process, a plating process, and the like, to fabricate an MLCC.

TABLE 1

| # | A (μm) | B (μm) | C (μm) | D (μm) | (B + C)/A | B/A | D/B | C/B | Add. electrode layer | Crack/Delam (#/200) | Acoustic Noise (dB) | obtainment of Cap. |
|---|---|---|---|---|---|---|---|---|---|---|---|---|
| 1* | 420.7 | 70.4 | 365.9 | 39.1 | 1.037 | 0.167 | 0.555 | 5.197 | X | 0 | 25.7 | OK |
| 2* | 447.1 | 147.3 | 362.1 | 22.7 | 1.139 | 0.329 | 0.154 | 2.458 | X | 1 | 17.9 | OK |
| 3* | 491.9 | 220.3 | 360.8 | 41.8 | 1.181 | 0.448 | 0.190 | 1.638 | X | 3 | 16.9 | OK |
| 4* | 498.1 | 270.2 | 360.5 | 4.9 | 1.266 | 0.543 | 0.018 | 1.334 | X | 2 | 16.8 | OK |
| 5* | 516.9 | 270.4 | 361.8 | 39.7 | 1.223 | 0.523 | 0.147 | 1.338 | X | 3 | 16.7 | OK |
| 6* | 407.5 | 421.8 | 189.1 | 14.9 | 1.499 | 1.035 | 0.035 | 0.448 | X | 5 | 16.6 | OK |
| 7* | 439.0 | 632.0 | 115.4 | 15.2 | 1.703 | 1.440 | 0.024 | 0.183 | X | 6 | 16.4 | OK |
| 8* | 520.0 | 643.4 | 190.7 | 15.2 | 1.604 | 1.237 | 0.024 | 0.296 | X | 5 | 16.4 | OK |
| 9* | 524.5 | 798.2 | 116.9 | 16.9 | 1.745 | 1.522 | 0.021 | 0.146 | X | 9 | 16.3 | OK |
| 10* | 405.5 | 40.2 | 365.4 | 39.9 | 1.000 | 0.099 | 0.993 | 9.090 | X | 0 | 29.5 | OK |

TABLE 1-continued

| # | A (μm) | B (μm) | C (μm) | D (μm) | (B + C)/A | B/A | D/B | C/B | Add. electrode layer | Crack/ Delam (#/200) | Acoustic Noise (dB) | obtainment of Cap. |
|---|---|---|---|---|---|---|---|---|---|---|---|---|
| 11* | 404.1 | 41.0 | 363.2 | 40.8 | 1.000 | 0.101 | 0.995 | 8.859 | O | 0 | 29.1 | OK |
| 12* | 436.0 | 70.4 | 365.9 | 69.7 | 1.001 | 0.161 | 0.990 | 5.197 | X | 0 | 25.7 | OK |
| 13* | 434.9 | 71.1 | 364.2 | 70.2 | 1.001 | 0.164 | 0.987 | 5.122 | O | 0 | 25.2 | OK |
| 14* | 455.5 | 90.8 | 364.3 | 91.5 | 0.999 | 0.199 | 1.008 | 4.012 | X | 0 | 23.1 | OK |
| 15* | 454.3 | 91.3 | 363.1 | 91.1 | 1.000 | 0.201 | 0.998 | 3.977 | O | 0 | 22.9 | OK |
| 16* | 427.5 | 94.3 | 362.8 | 35.1 | 1.069 | 0.221 | 0.372 | 3.847 | O | 0 | 22.4 | OK |
| 17 | 427.5 | 94.3 | 362.8 | 35.1 | 1.069 | 0.221 | 0.372 | 3.847 | O | 0 | 19.1 | OK |
| 18 | 440.8 | 121.2 | 359.8 | 40.7 | 1.091 | 0.275 | 0.336 | 2.969 | O | 0 | 17.2 | OK |
| 19 | 445.6 | 145.3 | 361.6 | 22.7 | 1.138 | 0.326 | 0.156 | 2.489 | O | 0 | 16.8 | OK |
| 20 | 470.0 | 171.0 | 364.4 | 40.2 | 1.139 | 0.364 | 0.235 | 2.131 | O | 0 | 16.7 | OK |
| 21 | 499.6 | 277.5 | 358.2 | 5.2 | 1.273 | 0.555 | 0.019 | 1.291 | O | 0 | 16.4 | OK |
| 22 | 518.2 | 278.0 | 358.7 | 40.9 | 1.229 | 0.537 | 0.147 | 1.290 | O | 0 | 16.4 | OK |
| 23 | 437.4 | 436.2 | 212.1 | 14.4 | 1.482 | 0.997 | 0.033 | 0.486 | O | 0 | 16.3 | OK |
| 24 | 441.5 | 638.9 | 114.5 | 15.0 | 1.707 | 1.447 | 0.023 | 0.179 | O | 0 | 16.4 | OK |
| 25 | 544.5 | 649.3 | 211.9 | 15.9 | 1.582 | 1.192 | 0.024 | 0.326 | O | 0 | 16.5 | OK |
| 26 | 540.8 | 840.1 | 113.3 | 14.9 | 1.763 | 1.553 | 0.018 | 0.135 | O | 0 | 16.3 | OK |
| 27* | 555.7 | 880.2 | 108.3 | 14.5 | 1.779 | 1.584 | 0.016 | 0.123 | O | 0 | 16.3 | NG |
| 28* | 556.4 | 897.7 | 100.2 | 14.6 | 1.794 | 1.614 | 0.016 | 0.112 | O | 0 | 16.3 | NG |
| 29* | 416.5 | 70.8 | 363.5 | 35.2 | 1.043 | 0.170 | 0.497 | 5.134 | O | 0 | 24.2 | OK |
| 30 | 423.2 | 89.8 | 363.2 | 30.2 | 1.070 | 0.212 | 0.336 | 4.045 | O | 0 | 23.7 | OK |
| 31 | 438.6 | 117.1 | 364.3 | 31.4 | 1.098 | 0.267 | 0.268 | 3.111 | O | 0 | 18.1 | OK |
| 32 | 447.1 | 147.3 | 362.1 | 22.7 | 1.139 | 0.329 | 0.154 | 2.458 | O | 0 | 17.1 | OK |
| 33 | 470.7 | 170.4 | 365.4 | 40.2 | 1.138 | 0.362 | 0.236 | 2.144 | O | 0 | 16.9 | OK |
| 34 | 520.7 | 277.5 | 361.8 | 40.2 | 1.228 | 0.533 | 0.145 | 1.304 | O | 0 | 16.3 | OK |
| 35 | 502.8 | 279.4 | 360.5 | 5.1 | 1.273 | 0.556 | 0.018 | 1.290 | O | 0 | 16.4 | OK |
| 36 | 434.9 | 434.8 | 210.1 | 14.8 | 1.483 | 1.000 | 0.034 | 0.483 | O | 0 | 16.3 | OK |
| 37 | 442.5 | 642.4 | 114.0 | 14.6 | 1.709 | 1.452 | 0.023 | 0.177 | O | 0 | 16.3 | OK |
| 38 | 544.9 | 654.2 | 209.9 | 15.8 | 1.586 | 1.201 | 0.024 | 0.321 | O | 0 | 16.3 | OK |
| 39 | 456.0 | 667.1 | 114.8 | 15.2 | 1.715 | 1.463 | 0.023 | 0.172 | O | 0 | 16.3 | OK |
| 40 | 535.2 | 822.3 | 116.1 | 15.9 | 1.753 | 1.536 | 0.019 | 0.141 | O | 0 | 16.3 | OK |
| 41* | 562.7 | 892.5 | 109.1 | 14.6 | 1.780 | 1.586 | 0.016 | 0.122 | O | 0 | 16.3 | NG |
| 42* | 559.5 | 903.3 | 100.6 | 14.4 | 1.794 | 1.615 | 0.016 | 0.111 | O | 0 | 16.3 | NG |

*indicates comparative example

Data in Table 1 was obtained by measuring dimensions of sections of the central portion of the ceramic body 12 of the laminated chip capacitor 10 taken in the length direction (L) and the thickness direction (T) from the central portion of the ceramic body 12 in the width (W) direction, based on images taken by a scanning electron microscope (SEM).

Here, as described above, A was defined as half of the overall thickness of the ceramic body, B was defined as a thickness of the lower cover layer, C was defined as half of the overall thickness of the active layer, and D was defined as a thickness of the upper cover layer.

In order to measure acoustic noise, a single sample (laminated chip capacitor) per board for measuring acoustic noise was discriminated in a vertical direction and mounted on a PCB, and then, the board was mounted in a measurement jig. Thereafter, a DC voltage and varied voltages were applied to both terminals of the sample mounted in the measurement jig by using a power DC power supply and a signal generator (or a function generator). Acoustic noise was measured through a microphone installed directly above the PCB.

In Table 1, "Add. electrode layer" means whether a sample had an additional electrode layer or not. Samples 1 to 13 were comparative examples which did not have an additional electrode layer. Samples 10 to 15 were comparative examples having symmetrical cover structure which means that the thickness (B) of the lower cover layer is almost similar to the thickness (D) of the upper cover layer.

Figure 11:
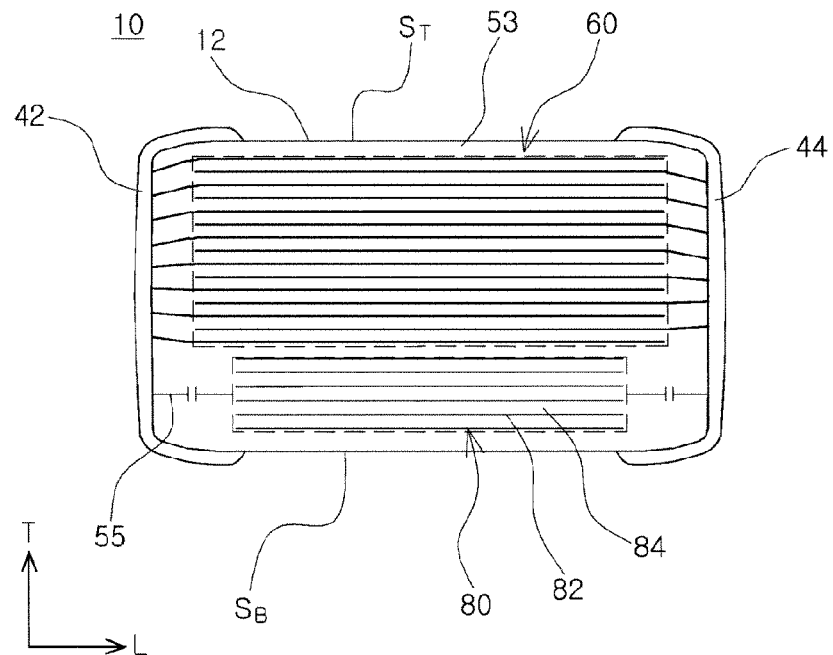
FIG. 11 is a schematic cross-sectional view showing additional electrode layers according to an embodiment of the present invention.

Samples 17 to 26 were embodiments according to the present invention having electrode patterns such as additional electrode layers illustrated in FIG. 11, and samples 16, 27 and 28 were comparative examples having electrode patterns such as additional electrode layers illustrated in FIG. 11.

Figure 12:
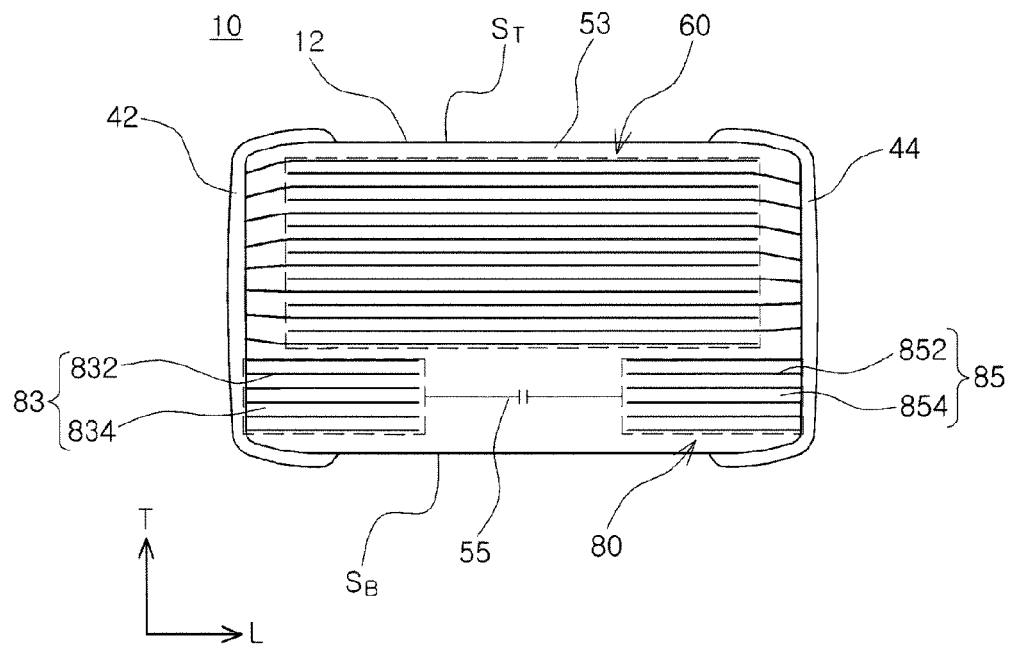
FIG. 12 is a cross-sectional view showing a first modification of the additional electrode layers according to an embodiment of the present invention.

Samples 30 to 40 were embodiments according to the present invention having electrode patterns such as additional electrode layers illustrated in FIG. 12, and samples 29, 41 and 42 were comparative examples having electrode patterns such as additional electrode layers illustrated in FIG. 12.

Embodiments of the present invention may have the upper cover layer 53 whose thickness (D) is the same to or thicker than 4 μm. If the thickness (D) of the upper cover layer is thinner than 4 μm, the internal electrode may be exposed from the upper surface $S_T$ of the ceramic body 12, resulting in a defective product.

The case that (B+C)/A is the same as or similar to 1 means that the central portion of the active layer is hardly deviated from the central portion of the ceramic body. (B+C)/A of the sample 1 to 3 having the symmetrical cover structure (that is, the thickness (B) of the lower cover layer is almost similar to the thickness (D) of the upper cover layer) is nearly 1.

The case that (B+C)/A is more than 1 may mean that the central portion of the active layer is deviated upward from the central portion of the ceramic body, and the case of (B+C)/A smaller than 1 may mean that the central portion of the active layer is deviated downward from the central portion of the ceramic body.

First, it can be seen that, samples 17 to 26 and 30 to 40, i.e., embodiments of the present invention, in which the ratio ((B+C)/A) by which the central portion of the active layer deviates from the central portion of the ceramic body satisfied 1.069≤(B+C)/A≤1.763, and additional electrodes were formed, had drastically reduced acoustic noise less than 20 dB and did not have delamination nor cracks.

It can be seen that samples 1, 10 to 15, 16 and 29, in which the ratio ((B+C)/A) by which the central portion of the active layer deviates from the central portion of the ceramic body was less than 1.069, had a tendency of high acoustic noise irrespective of presence and absence of additional electrodes.

It can be seen that samples 2 to 9, in which the ratio ((B+C)/A) by which the central portion of the active layer deviates from the central portion of the ceramic body satisfied the range $1.069 \leq (B+C)/A \leq 1.763$ but no additional electrode was formed, seen to be effective for reducing acoustic noise, but some of them had delamination or cracks.

Samples 27, 28, 41 and 42, in which the ratio (B+C)/A was more than 1.763, had a lack of capacitance. That is, the capacitance of samples 27, 28, 41 and 42 is significantly lower than a target capacitance. In Table 1, "NG" of the "obtainment of Cap." (i.e., a rate of the capacitance of sample relative to a target capacitance means that the capacitance of sample is less than 80% of the target capacitance, when the target capacitance is 100%.

Comparative examples in which the ratio (D/B) of the thickness (D) of the upper cover layer to the thickness (B) of the lower cover layer was more than 0.372, did not have an acoustic noise reduction effect. If the ratio D/B is less than 0.018, the thickness (B) of the lower cover layer is too thicker than the thickness (D) of the upper cover layer, such that crack or unacceptable delamination may occur, or lack of capacitance may occur.

It can be seen that samples 17 to 26 and 30 to 40, in which the ratio (B/A) of the thickness (B) of the lover cover layer to the half (A) of the thickness of the ceramic body satisfied $0.215 \leq B/A \leq 1.553$ or the ratio (C/B) of the half (C) of the thickness of the active layer to the thickness (B) of the lower cover layer satisfied $0.135 \leq C/B \leq 3.987$ and additional electrodes were formed, had considerably reduced acoustic noise and did not have delamination nor cracks.

Samples 1, 10 to 15, 16 and 29, in which in which the ratio (B/A) of the thickness (B) of the lover cover layer to the half (A) of the thickness of the ceramic body was less than 0.215, did not have an acoustic noise reduction effect no matter whether or not they had additional electrode layers. Also, when the ratio B/A exceeds 1.553, capacitance in relation to a target capacitance cannot be obtained.

Samples 1, 10 to 15, 16 and 29, in which the ratio (C/B) of the half (C) of the thickness of the active layer to the thickness (B) of the lower cover layer exceeded 3.987, did not have an acoustic noise reduction effect no matter whether or not they have additional electrode layers. Also, when the ratio C/B is less than 0.135, capacitance in relation to a target capacitance cannot be obtained.

Modification of Additional Electrode Layer

The additional electrode layer may be implemented to have various shapes as shown in FIGS. 11 through 18.

Additional electrode layers 80 according to an embodiment of FIG. 11 may be floating electrode layers which are laminated in the thickness direction and face the first external electrode 42 and the second external electrode 44 without being in electrically contact therewith in the lower cover layer 55.

Additional electrode layers 80 according to an embodiment of FIG. 12 may include first array electrode layers 83 and second array electrode layers 85 disposed to face the first array electrode layer 83 based on the central portion of the ceramic body 12 in the length direction.

The first array electrode layers 83 may include first electrode patterns 832 extending from the first external electrode 42 to the inner side of the ceramic body 12 in the length direction and dielectric layers 834, and here, the first electrode patterns 832 may be laminated, while having the dielectric layers 834 interposed therebetween, in the thickness direction.

The second array electrode layers 85 may include second electrode patterns 852 extending from the second external electrode 44 to the inner side of the ceramic body 12 in the length direction to oppose the first electrode patterns 832 and dielectric layers 854, and here, the second electrode patterns 852 may be laminated, while having the dielectric layers 854 interposed therebetween, in the thickness direction.

Figure 13:
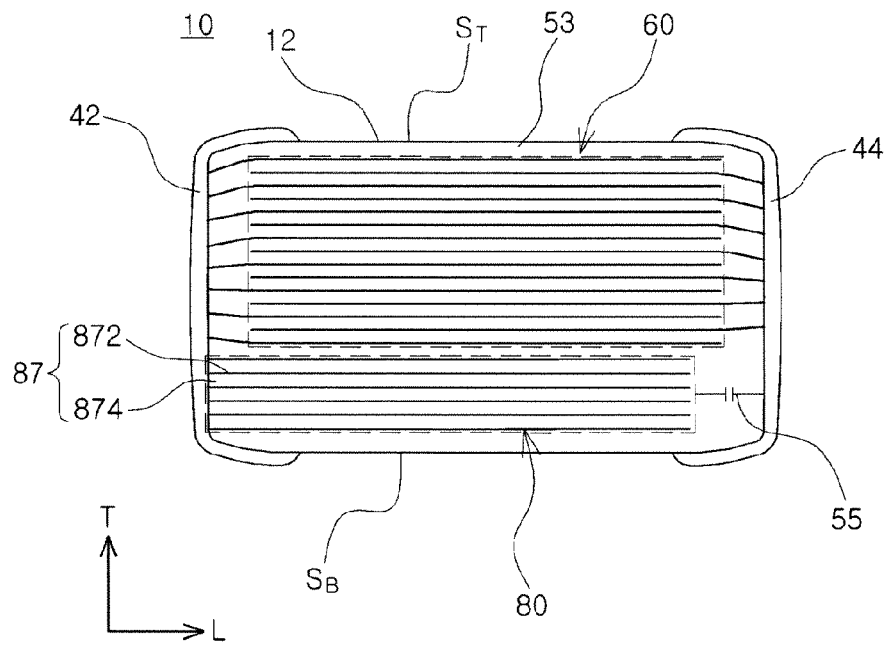
FIG. 13 is a cross-sectional view showing a second modification of the additional electrode layers according to an embodiment of the present invention.

Additional electrode layers 80 according to an embodiment of FIG. 13 may extend inwardly in the length direction from the first external electrode 42 to oppose the second external electrode 44, and may be laminated in the thickness direction so as to be formed.

Conversely, the additional electrode layer 80 may extend inwardly in the length direction from the second external electrode 44 to oppose the first external electrode 42, and may be laminated in the thickness direction so as to be formed.

Figure 14:
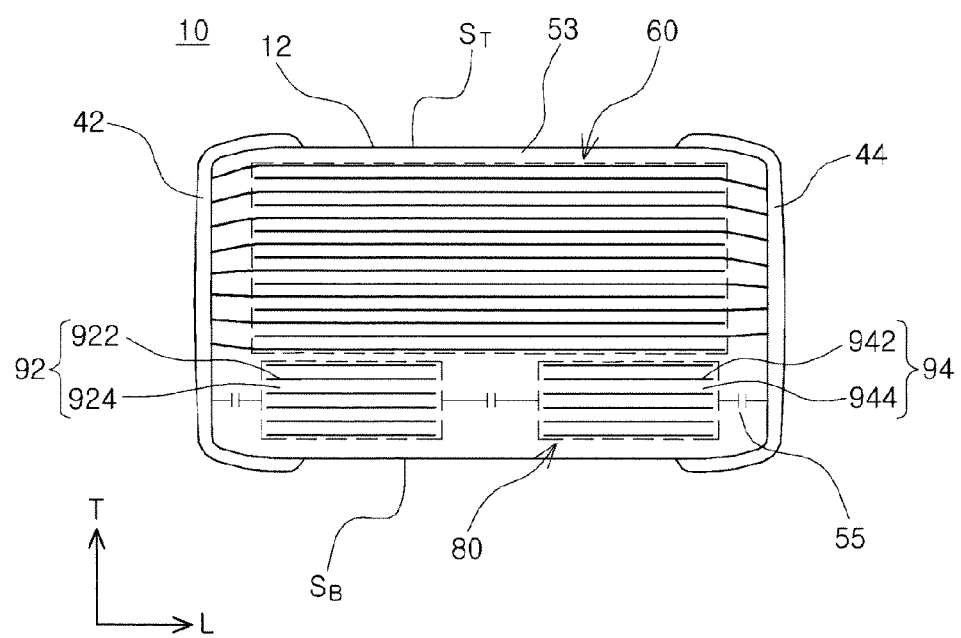
FIG. 14 is a cross-sectional view showing a third modification of the additional electrode layers according to an embodiment of the present invention.

Additional electrode layers 80 according to an embodiment of FIG. 14 may be implemented as a plurality of floating electrode layers 92 and 94 laminated in the thickness direction and face the first external electrode 42 and the second external electrode 44. Internal electrode patterns 922 and 942 facing the first external electrode 42 and the second external electrode 44 may face each other inwardly of the ceramic body 12 in the length direction.

Figure 15:
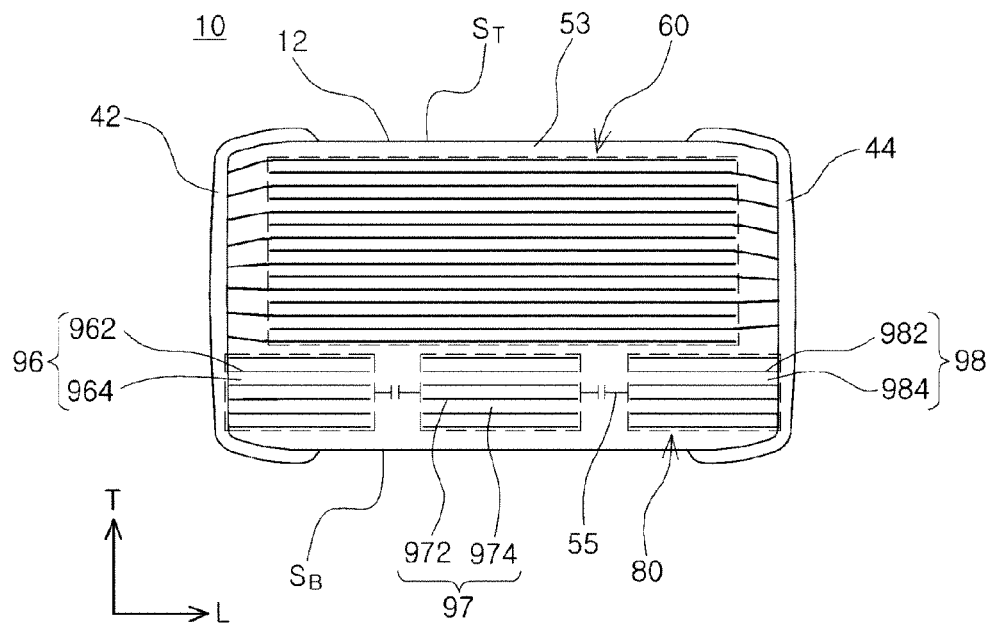
FIG. 15 is a cross-sectional view showing a fourth modification of the additional electrode layers according to an embodiment of the present invention.

Additional electrode layers 80 according to an embodiment of FIG. 15 may include a first array electrode layer 96, a second array electrode layer 98, and a floating electrode layer 97.

The first array electrode layer 96 may include first electrode patterns 962 extending inwardly from the first external electrode 42 in the length direction and dielectric layers 964, and the first electrode patterns 962 may be laminated, while having the dielectric layers 964 interposed therebetween, in the thickness direction.

The second array electrode layer 98 may include second electrode patterns 982 extending inwardly from the second external electrode 44 in the length direction to oppose the first electrode patterns 962 and dielectric layers 984, and the second electrode patterns 982 may be laminated, while having the dielectric layers 984 interposed therebetween, in the thickness direction.

The floating electrode layers 97 may be formed between the first array electrode layers 96 and the second array electrode layers 86 and include electrode patterns 972 opposed to the first array electrode layers 96 and the second array electrode layers 98 and dielectric layers 974. Here, the electrode patterns 972 may be laminated, while having the dielectric layers 984 interposed therebetween, in the thickness direction.

Figure 16:
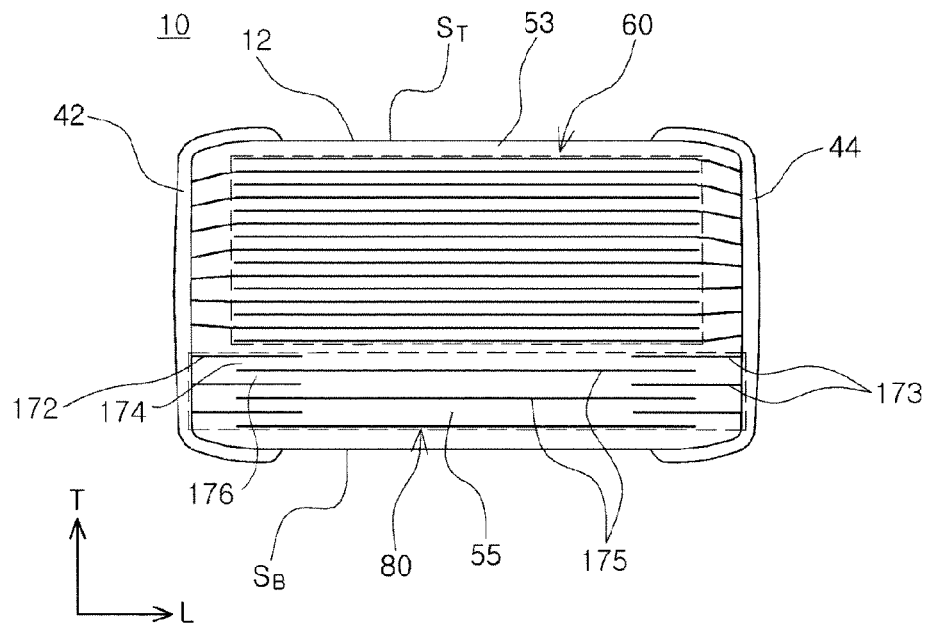
FIG. 16 is a cross-sectional view showing a fifth modification of the additional electrode layers according to an embodiment of the present invention.

Additional electrode layers 80 according to an embodiment of FIG. 16 may include a first electrode pattern 172 and a second electrode pattern 173 extending inwardly from the first external electrode 42 and the second external electrode 44 in the length direction to face each other, respectively, and a floating electrode pattern 175 disposed in an opposing manner between the first electrode patterns 172 and the second electrode patterns 173, while having a dielectric layer 174 interposed therebetween.

Namely, the additional electrode layers 80 according to the present embodiment may be formed by laminating the dielectric layer 174 with the first electrode pattern 172 and the second electrode pattern 173 formed thereon and a dielectric layer 176 with the floating electrode pattern 175 formed thereon in the thickness direction.

Figure 17:
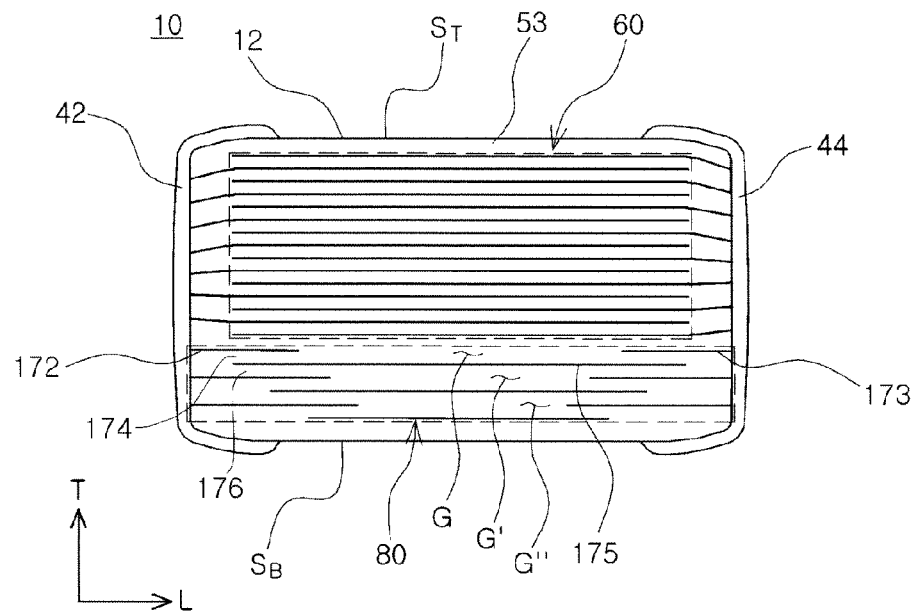
FIG. 17 is a cross-sectional view showing a sixth modification of the additional electrode layers according to an embodiment of the present invention.

Like the additional electrode layers 80 of FIG. 16, additional electrode layers 80 according to an embodiment of FIG. 17 may be formed by laminating the dielectric layer 174 with the first electrode pattern 172 and the second electrode pattern 173 formed thereon and the dielectric layer 176 with the floating electrode pattern 175 formed thereon in the thickness direction.

Here, gaps G, G', and G" formed as the first electrode pattern 172 and the second electrode pattern 173 face in the length direction may be increased in the lamination direction.

Alternatively, the gaps G, G', and G" may be reduced in the lamination direction.

Figure 18:
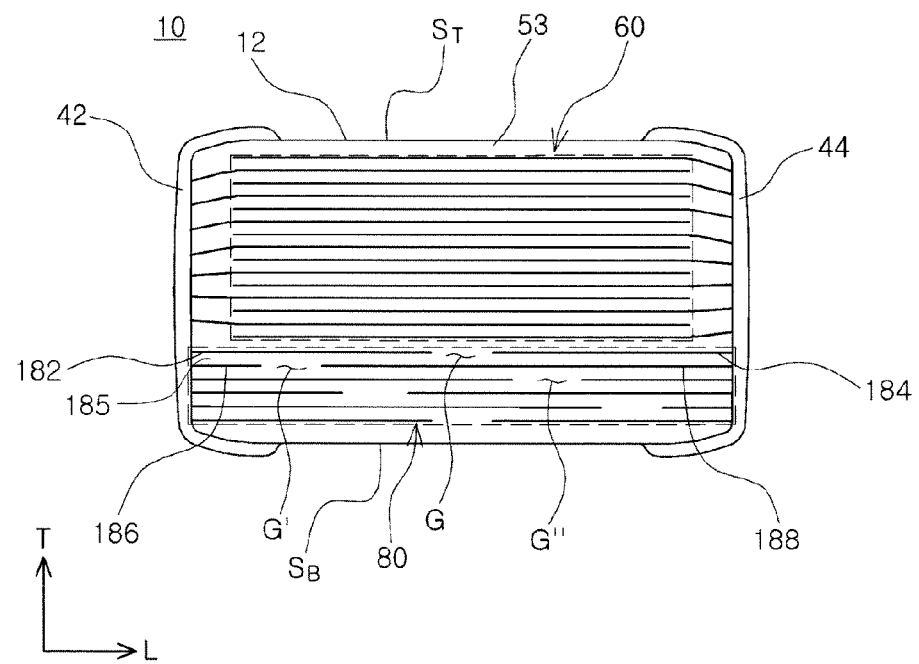
FIG. 18 is a cross-sectional view showing a seventh modification of the additional electrode layers according to an embodiment of the present invention.

Additional electrode layers 80 according to an embodiment of FIG. 18 may include a first electrode pattern 182, a second electrode pattern 184, a third electrode pattern 186, and a fourth electrode pattern 188.

The first electrode pattern 182 and the second electrode pattern 184 may extend inwardly from the first external electrode and the second external electrode in the length direction, respectively, to oppose each other.

Also, the third electrode pattern 186 and the fourth electrode pattern 188 may be disposed to face the first electrode pattern 182 and the second electrode pattern 184, while having a dielectric layer 185 interposed therebetween. The third electrode pattern 186 and the fourth electrode pattern 188 may extend inwardly from the first external electrode and the second external electrode in the length direction, respectively, to oppose each other.

Here, a gap G formed between the first electrode pattern 182 and the second electrode pattern 184 in the length direction and a gap G' formed between the third electrode pattern 186 and the fourth electrode pattern 188 in the length direction may be offset in the lamination direction.

As set forth above, in the case of the laminated chip capacitor and the board for mounting the same according to embodiments of the invention, acoustic noise can be significantly reduced irrespective of the size of the electrode pads.

While the present invention has been shown and described in connection with the embodiments, it will be apparent to those skilled in the art that modifications and variations can be made without departing from the spirit and scope of the invention as defined by the appended claims.

What is claimed is:

1. A laminated chip electronic component comprising:
a ceramic body including internal electrodes and dielectric layers;
first and second external electrodes formed to cover both end portions of the ceramic body in a length direction;
an active layer in which the internal electrodes are disposed in an opposing manner, while having the dielectric layers interposed therebetween, to form capacitance;
upper and lower cover layers formed on upper and lower portions of the active layer in a thickness direction, the lower cover layer having a thickness greater than that of the upper cover layer; and
additional electrode layers disposed irrespective of a formation of capacitance within the lower cover layer,
wherein when half of a thickness of the ceramic body is defined as A, a thickness of the lower cover layer is defined as B, half of a thickness of the active layer is defined as C, and a thickness of the upper cover layer is defined as D, the thickness (D) of the upper cover layer satisfies a range of D≥4 μm and a ratio (B+C)/A by which a central portion of the active layer deviates from a central portion of the ceramic body satisfies a range of 1.069≤(B+C)/A≤1.763.

2. The laminated chip electronic component of claim 1, wherein a ratio (D/B) of the thickness (D) of the upper cover layer to the thickness (B) of the lower cover layer satisfies 0.018≤D/B≤0.372.

3. The laminated chip electronic component of claim 1, wherein a ratio (B/A) of the thickness (B) of the lover cover layer to the half (A) of the thickness of the ceramic body satisfies 0.215≤B/A≤1.553.

4. The laminated chip electronic component of claim 1, wherein a ratio (C/B) of the half (C) of the thickness of the active layer to the thickness (B) of the lower cover layer satisfies 0.135≤C/B≤3.987.

5. The laminated chip electronic component of claim 1, wherein a mark for differentiating upper and lower portions is formed on at least one of upper and lower surfaces of the ceramic body.

6. The laminated chip electronic component of claim 1, wherein the additional electrode layers comprise:
a first array electrode layer formed by laminating first electrode patterns extending inwardly from the first external electrode in a length direction, while having dielectric layers interposed therebetween, in a thickness direction; and
a second array electrode layer formed by laminating second electrode patterns extending inwardly from the second external electrode in the length direction to face the first electrode patterns, while having dielectric layers interposed therebetween, in the thickness direction.

7. The laminated chip electronic component of claim 1, wherein the additional electrode layers comprise floating electrode layers facing the first external electrode and second external electrode and laminated in the thickness direction.

8. The laminated chip electronic component of claim 1, wherein the additional electrode layers extend inwardly from the first external electrode or the second external electrode in the length direction to face the second external electrode or the first external electrode having a different polarity, and laminated in the thickness direction.

9. The laminated chip electronic component of claim 1, wherein the additional electrode layers are a plurality of floating electrode layers facing the first external electrode and the second external electrode and laminated in the thickness direction, and the plurality of floating electrode layers face inwardly in the length direction.

10. The laminated chip electronic component of claim 1, wherein the additional electrode layers comprise:
a first array electrode layer formed by laminating first electrode patterns extending inwardly from the first external electrode in the length direction, while having dielectric layers interposed therebetween, in the thickness direction;
a second array electrode layer formed by laminating second electrode patterns extending inwardly from the second external electrode in the length direction to face the first electrode patterns, while having dielectric layers interposed therebetween, in the thickness direction; and
a floating electrode layer formed between the first array electrode layer and the second array electrode layer and facing the first array electrode layer and the second array electrode layer.

11. The laminated chip electronic component of claim 1, wherein the additional electrode layers comprise:
a first electrode pattern and a second electrode pattern extending inwardly from the first external electrode and the second external electrode in the length direction, respectively, and opposed to each other; and a floating electrode pattern disposed in an opposing manner between the first electrode pattern and the second electrode pattern, while having a dielectric layer interposed therebetween.

12. The laminated chip electronic component of claim 11, wherein a gap formed between the first electrode pattern and the second electrode pattern in the length direction has directionality such that the gap is reduced or increased in a lamination direction.

13. The laminated chip electronic component of claim 1, wherein the additional electrode layers comprise:
a first electrode pattern and a second electrode pattern extending inwardly from the first external electrode and the second external electrode in the length direction, respectively, and opposed to each other; and
a third electrode pattern and a fourth electrode pattern disposed to face the first electrode pattern and the second electrode pattern, while having a dielectric layer interposed therebetween, and extending inwardly from the first external electrode and the second external electrode in the length direction, respectively, to face each other,
wherein a gap between the first electrode pattern and the second electrode pattern in the length direction and a gap between the third electrode pattern and the fourth electrode pattern in the length direction is offset in the lamination direction.

14. A board for mounting a laminated chip electronic component, comprising:
a laminated chip electronic component of claim 1;
electrode pads electrically connected to the external electrodes through soldering; and
a printed circuit board (PCB) on which the electrode pads are formed and the laminated chip electronic component is mounted on the electrode pads such that the internal electrodes are horizontal and the lower cover layer is disposed in a lower position than the upper cover layer in a thickness direction.

15. The board of claim 14, wherein due to a difference between strain generated in a central portion of the active layer and that generated in the lower cover layer as a voltage is applied, a point of inflection (PI) formed at both end portions of the ceramic body in a length direction is formed to be lower than the height of the soldering.

16. A packing unit comprising:
a laminated chip electronic component of claim 1; and
a packing sheet including a receiving portion for receiving the laminated chip electronic component,
wherein the internal electrodes are disposed to be aligned horizontally based on a lower surface of the receiving portion.

17. The packing unit of claim 16, further comprising:
a packing film coupled to the packing sheet and covering the laminated chip electronic component.

18. The packing unit of claim 16, wherein the packing sheet in which the laminated chip electronic component is received is wound as a reel type.

19. The packing unit of claim 16, wherein each of the laminated chip electronic components received in the receiving portion is disposed such that the lower cover layer thereof faces the lower surface of the receiving portion.

20. The packing unit of claim 19, wherein a mark for differentiating upper and lower portions is formed on an upper surface of the ceramic body.

21. The packing unit of claim 16, wherein each of the laminated chip electronic components received in the receiving portion has directionality such that any one of the upper cover layer and the lower cover layer faces the lower surface of the receiving portion, and a mark is formed on the ceramic body in order to allow the directionality in which any one of the upper cover layer and the lower cover layer faces the lower surface of the receiving portion, to be recognized from the outside.

22. A laminated chip electronic component comprising:
external electrodes formed on both end portions of a ceramic body having a hexahedral shape in a length direction;
an active layer formed within the ceramic body and including a plurality of internal electrodes disposed to face each other, while having dielectric layers interposed therebetween to form capacitance;
an upper cover layer formed on an upper portion of the uppermost internal electrode of the active layer;
a lower cover layer formed on a lower portion of the lowermost internal electrode of the active layer and having a thickness greater than that of the upper cover layer; and
additional layers disposed irrespective of a formation of capacitance within the lower cover layer,
wherein when half of the overall thickness of the ceramic body is defined as A, a thickness of the lower cover layer is defined as B, and half of the overall thickness of the active layer is defined as C,
a ratio (B+C)/A by which a central portion of the active layer deviates from a central portion of the ceramic body satisfies $1.069 \leq (B+C)/A \leq 1.763$.

* * * * *